(12) United States Patent
Caywood

(10) Patent No.: US 6,479,863 B2
(45) Date of Patent: Nov. 12, 2002

(54) METHOD AND APPARATUS FOR INJECTING CHARGE ONTO THE FLOATING GATE OF A NONVOLATILE MEMORY CELL

(75) Inventor: John M. Caywood, 1410 Wright Ave., Sunnyvale, CA (US) 94087

(73) Assignee: John M. Caywood, San Jose, CA (US)

( * ) Notice: Subject to any disclaimer, the term of this patent is extended or adjusted under 35 U.S.C. 154(b) by 36 days.

(21) Appl. No.: 09/731,942

(22) Filed: Dec. 6, 2000

(65) Prior Publication Data

US 2001/0019151 A1 Sep. 6, 2001

Related U.S. Application Data

(63) Continuation of application No. 09/522,252, filed on Mar. 9, 2000, which is a continuation of application No. 09/275,168, filed on Mar. 24, 1999, now abandoned.

(51) Int. Cl.$^7$ .................. H01L 29/06; H01L 29/76; H01L 29/788
(52) U.S. Cl. .................. 257/321; 257/36; 257/37; 257/38; 257/39; 257/314; 257/316; 257/320; 257/322
(58) Field of Search ...................... 257/36–39, 314–326

(56) References Cited

U.S. PATENT DOCUMENTS

| 3,778,645 A | 12/1973 | Mattauch et al. .......... 307/318 |
| 4,035,820 A | 7/1977 | Matzen ........................ 357/23 |

(List continued on next page.)

FOREIGN PATENT DOCUMENTS

| JP | 364076766 A | * 3/1989 | ................. 257/39 |
| JP | 2964412 | 10/1999 | |

OTHER PUBLICATIONS

Dons, et al., "Direct Tunneling Diode Structure with a Multi-Layer Charge Injection Barrier", *29th IEEE Semiconductor Interface Specialists Conference* (1998).

(List continued on next page.)

*Primary Examiner*—Eddie Lee
*Assistant Examiner*—Jesse A Fenty
(74) *Attorney, Agent, or Firm*—Thelen Reid & Priest LLP; David B. Ritchie

(57) ABSTRACT

A tunneling charge injector includes a conducting injector electrode, a grid insulator disposed adjacent the conducting injector electrode, a grid electrode disposed adjacent the grid insulator, a retention insulator disposed adjacent the grid electrode, and a floating gate electrode disposed adjacent the retention insulator. In the tunneling charge injector, charge is injected from the conducting injector electrode onto the floating gate. Electrons are injected onto the floating gate when the conducting injector electrode is negatively biased with respect to the grid electrode, and holes are injected onto the floating gate when the conducting injector electrode is positively biased with respect to the grid electrode. The tunneling charge injector is employed in a nonvolatile memory cell having a nonvolatile memory element with a floating gate such as a floating gate MOS transistor. In the nonvolatile memory cell, the floating gate of the tunneling charge injector is coupled to or forms a part of the floating gate of the nonvolatile memory element. The tunneling charge injector is employed to inject charge onto the floating gate of the nonvolatile memory element. A memory device includes an array of nonvolatile memory cells wherein each of the memory cells comprises a nonvolatile memory element with a floating gate such as a floating gate MOS transistor and a tunneling charge injector having a floating gate that is either coupled to the floating gate of the nonvolatile memory element or forms a portion of the floating gate of the nonvolatile memory element.

43 Claims, 14 Drawing Sheets

U.S. PATENT DOCUMENTS

| | | | |
|---|---|---|---|
| 4,037,242 A | 7/1977 | Gosney | 357/23 |
| 4,513,397 A | 4/1985 | Ipri et al. | 365/185 |
| 4,626,887 A | 12/1986 | Schmitt-Landsiedel et al. | 357/43 |
| 4,630,081 A | 12/1986 | Calviello | 357/6 |
| 4,686,558 A | 8/1987 | Adam | 357/42 |
| 4,752,912 A | 6/1988 | Guterman | 365/185 |
| 4,907,197 A | 3/1990 | Uchida | 365/185 |
| 4,907,198 A | 3/1990 | Arima | 365/185 |
| 4,910,565 A | 3/1990 | Masuoka | 357/23.5 |
| 4,924,437 A | 5/1990 | Paterson et al. | 365/185 |
| 4,967,393 A | 10/1990 | Yokoyama et al. | 365/185 |
| 5,101,249 A | 3/1992 | Hijiya et al. | 357/23.5 |
| 5,111,430 A | 5/1992 | Morie | 365/185 |
| 5,235,544 A | 8/1993 | Caywood | 365/185 |
| 5,338,952 A | 8/1994 | Yamauchi | 257/315 |
| 5,347,143 A * | 9/1994 | Schroder | 505/191 |
| 5,359,571 A | 10/1994 | Yu | 365/230.03 |
| 5,517,044 A * | 5/1996 | Koyama | 257/316 |
| 5,679,970 A * | 10/1997 | Hartmann | 257/320 |
| 5,838,039 A | 11/1998 | Sato et al. | 257/321 |
| 5,841,161 A | 11/1998 | Lim et al. | 257/315 |
| 5,946,240 A | 8/1999 | Hisamune | 365/185.28 |
| 5,977,586 A | 11/1999 | Crisenza et al. | 257/326 |
| 6,002,152 A | 12/1999 | Guterman et al. | 257/316 |

OTHER PUBLICATIONS

Guo, Xin, "Tunneling Leakage Current in Oxynitride: Dependence on Oxygen/Nitrogen Content", *IEEE, Electron Device Letters*, vol. 19, No. 6, pp. 207–209 (1998).

Huber et al, "Hot–Electron Transport in Al–$Al_2O_3$ Triodes Produced by Plasma Oxidation", *Journal of Applied Physics*, vol. 39, No. 11, pp. 5104–5116 (1968).

Krolikowski, "Photoemission Studies of the Noble Metals. I. Copper", *Physical Review*, vol. 185, No. 3, pp. 882–900 (1969).

Krolikowski, "Photoemission Studies of the Noble Metals II. Gold", *Physical Review B*, vol. 1, No. 2, pp. 478–487 (1970).

Mead, "Operation of Tunnel–Emission Devices", *J. Appl. Phys.*, vol. 32, No. 4 (1961).

Mead, "The Tunnel–Emission Amplifier", *Proceedings of IRE*, pp. 359–361 (1960).

* cited by examiner

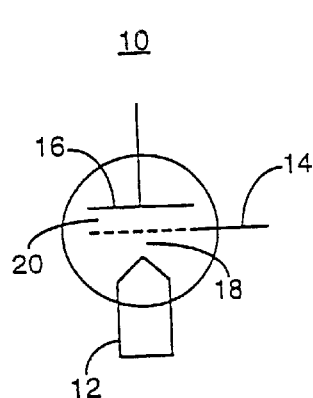
Figure 1a
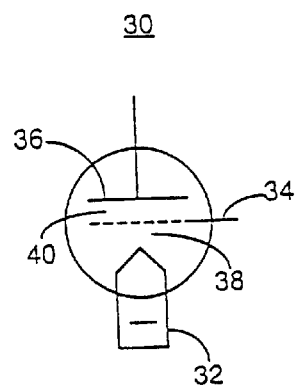
Figure 1b
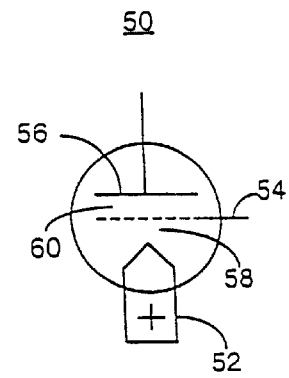
Figure 1c
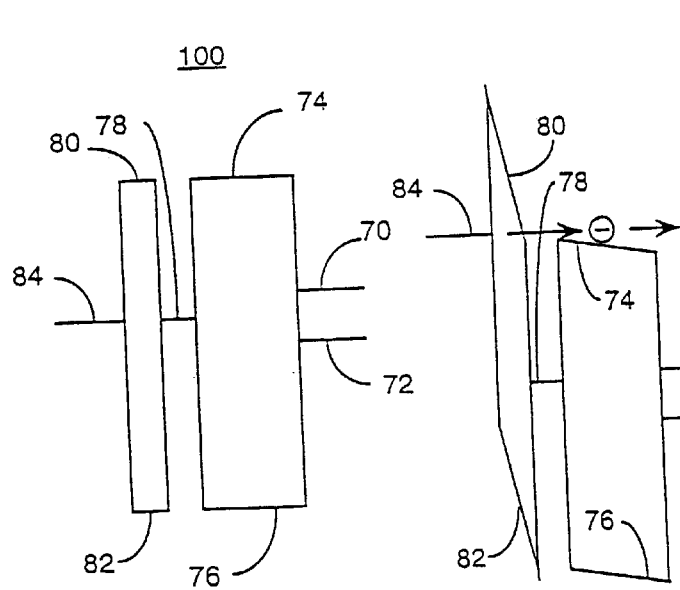
Figure 2a
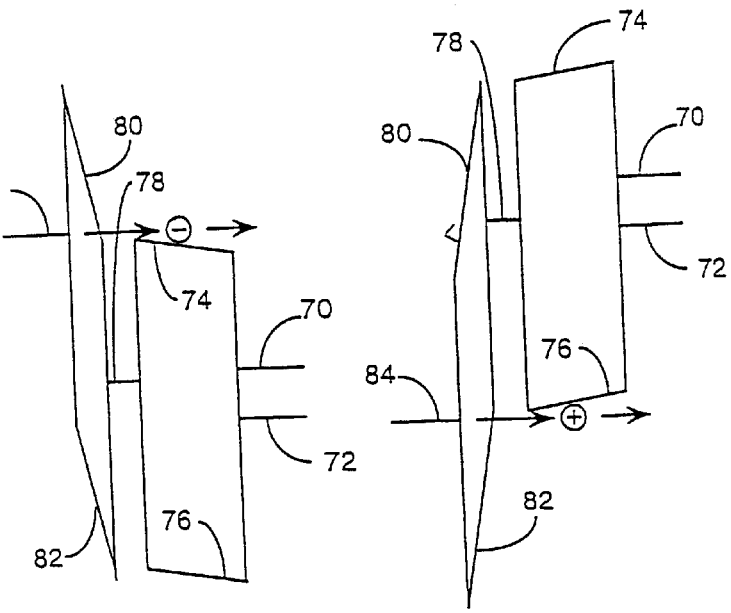
Figure 2b
Figure 2c

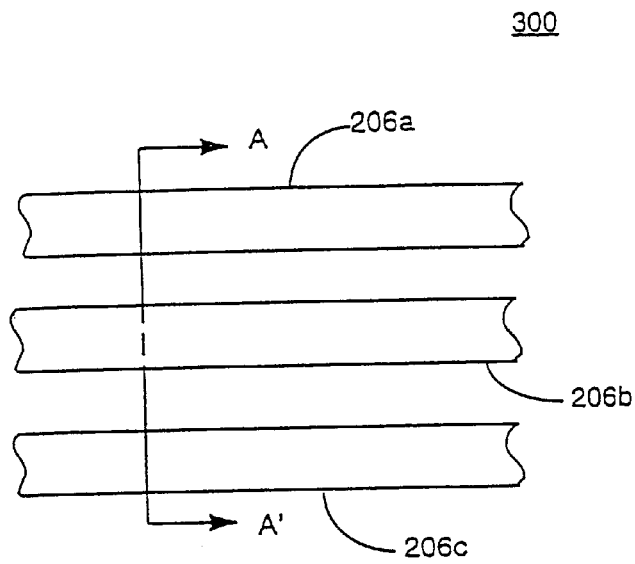
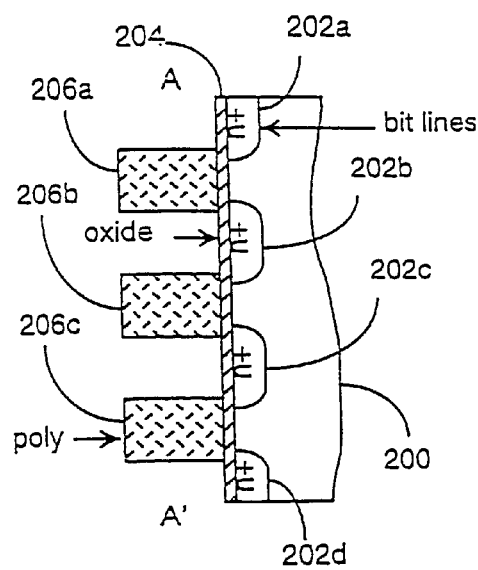
Figure 9a
Figure 9b
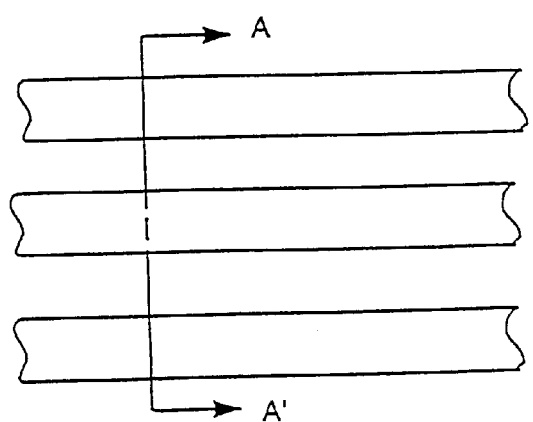
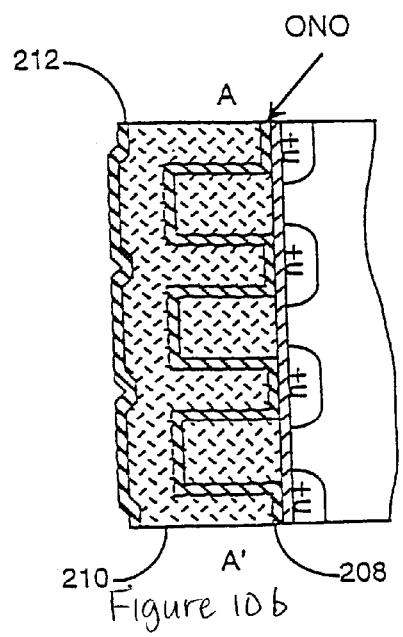
Figure 10a
Figure 10b

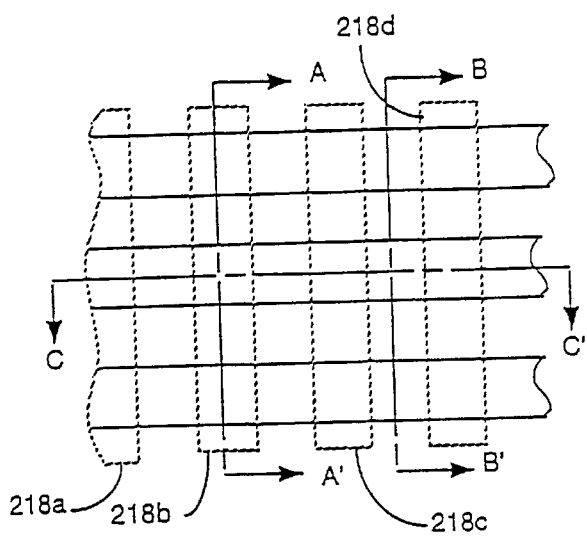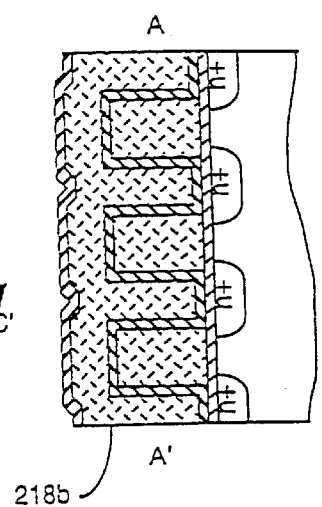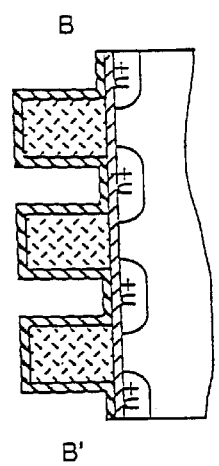
Figure 11a  Figure 11b  Figure 11c
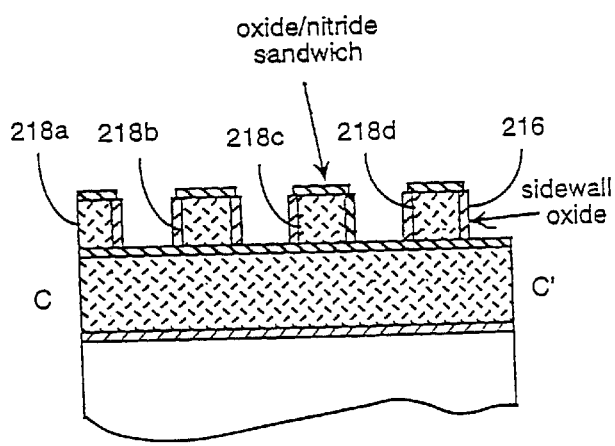
Figure 11d

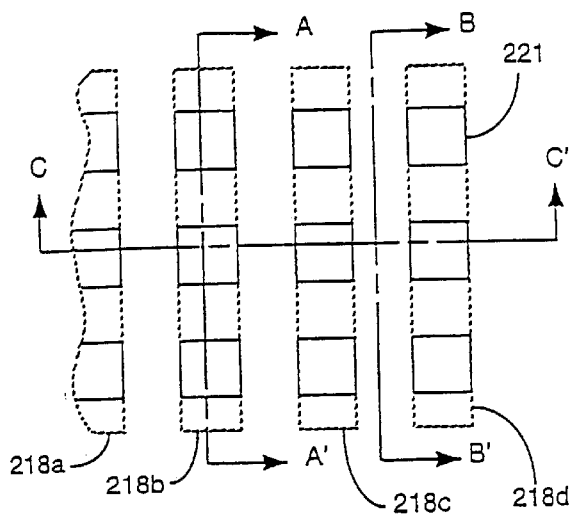
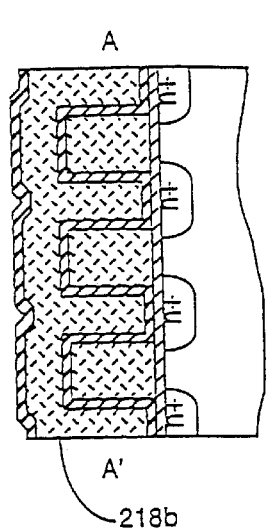
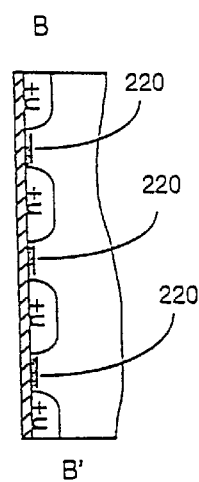
Figure 12a　　　　　Figure 12b　　　Figure 12c
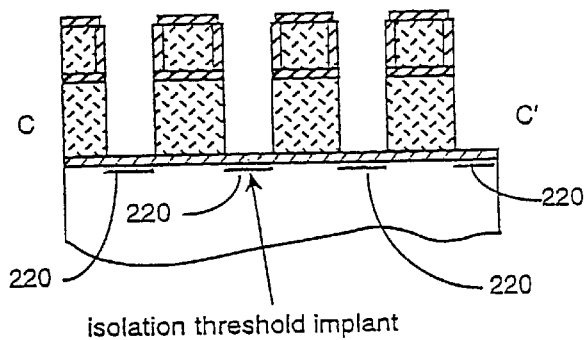
Figure 12d

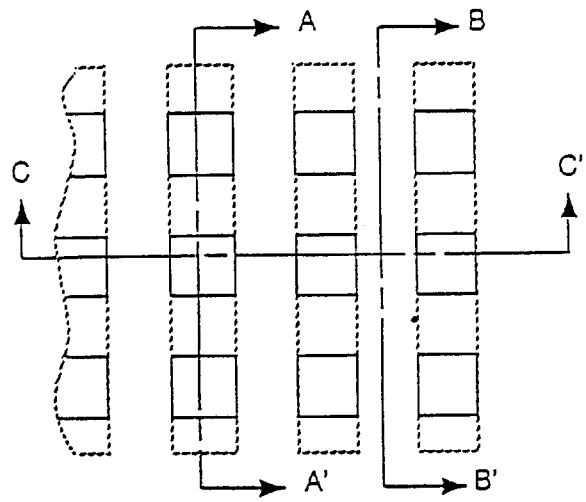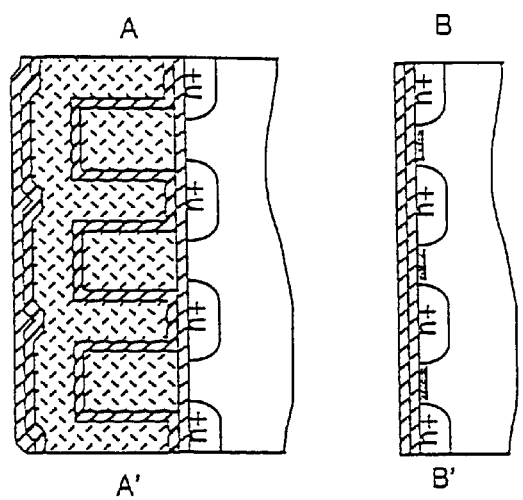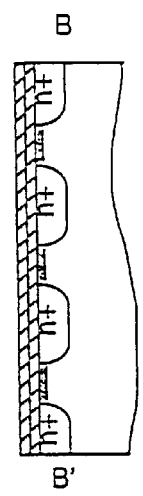
Figure 14a  Figure 14b  Figure 14c
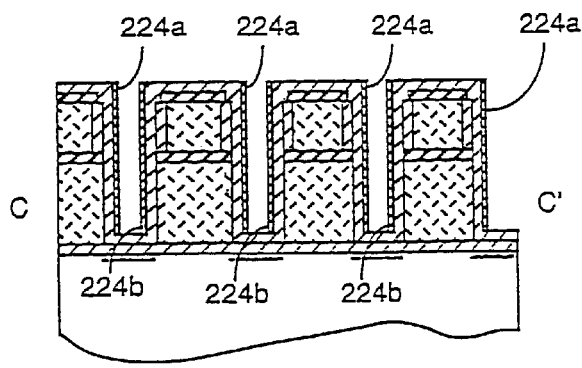
Figure 14d

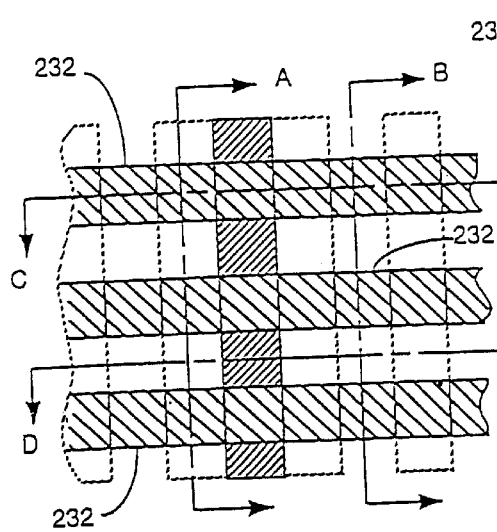
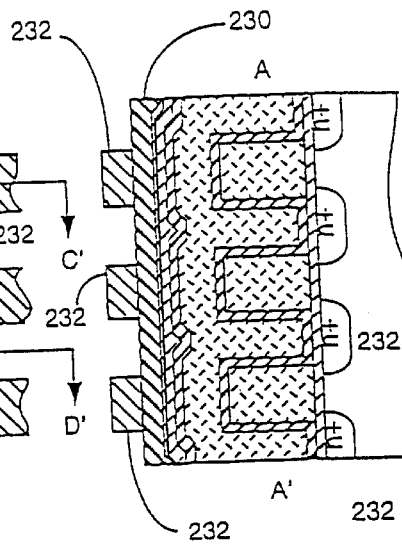
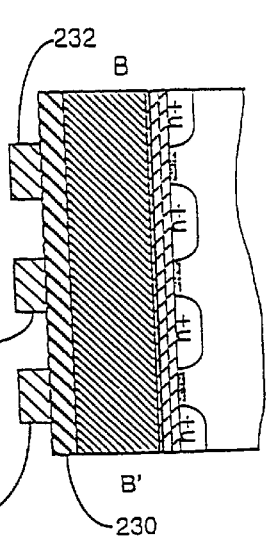
Figure 18a     Figure 18b     Figure 18c
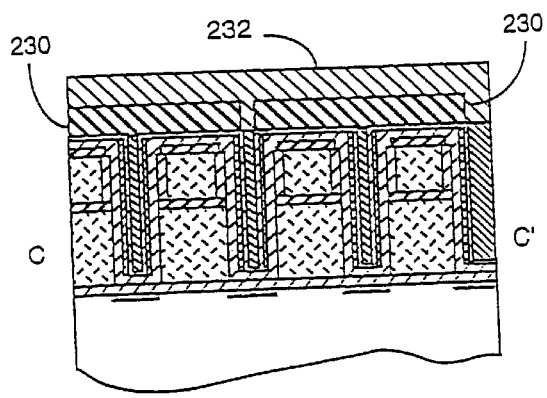
Figure 18d
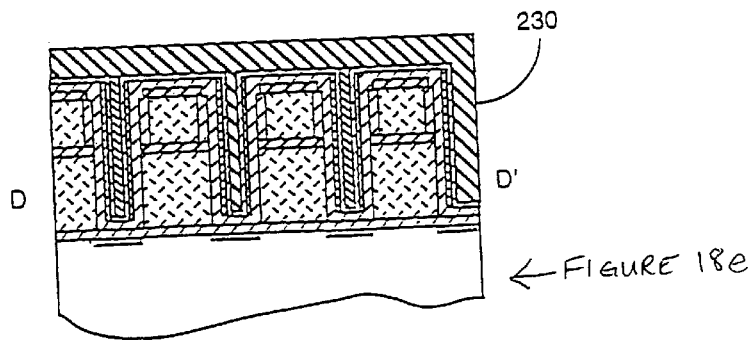
Figure 18e

METHOD AND APPARATUS FOR INJECTING CHARGE ONTO THE FLOATING GATE OF A NONVOLATILE MEMORY CELL

CROSS-REFERENCE TO RELATED APPLICATIONS

This application is a continuation of co-pending U.S. patent application Ser. No. 09/522,252 filed Mar. 9, 2000, which is, in turn, a continuation of U.S. patent application Ser. No. 09/275,168 filed Mar. 24, 1999, now abandoned, in the name of inventor John M. Caywood and commonly owned herewith. The entirety of these prior application is herby incorporated by reference as if set forth fully herein.

BACKGROUND OF THE INVENTION

1. Field of the Invention

The present invention relates to nonvolatile memory. More particularly, the present invention relates to methods and apparatus for injecting electrons and holes onto the floating gate of a floating gate MOS transistor nonvolatile memory cell.

2. The Prior Art

Nonvolatile memories employing floating gate technology have found wide use in a variety of applications, and have become an increasingly important implementation of semiconductor nonvolatile memory. In a floating gate nonvolatile memory, the floating gate electrode of an MOS transistor is electrically isolated from neighboring electrodes by a high quality dielectric that surrounds the floating gate. The state of memory, whether a '0' or a '1', is determined by the amount of charge on the floating gate.

In a memory known to those of ordinary skill in the art as flash memory, electrons are commonly added to the floating gate by a process of hot electron injection that is controlled by the bias applied to various elements of the floating gate transistor. To remove electrons from the floating gate, electrons tunnel from the floating gate to surrounding electrodes under the influence of a high electric field. In the most common form of this technology, the electrons are caused to tunnel from the floating gate to an underlying silicon region by applying a bias across a relatively thin layer of silicon dioxide. In order that the charge be retained on the floating gate for an extended period of time, it is important that the tunneling operate in what is referred to by those of ordinary skill in the art as the Fowler-Nordheim mode so that the current under cell storage and read conditions is very low, typically less than $10^{-15}$ A/cm$^2$.

It has been demonstrated that to restrict tunneling to the Fowler-Nordheim mode, the oxide through which the electrons tunnel should be thicker than about 5 nanometers. Naruke, K., et al, "Stress Induced Leakage Current Limiting to Scale Down EEPROM Tunnel Oxide Thickness", IEDM Tech. Digest, pp. 424–7 (1988). Further, the 5 nm lower bound is not a practical limit because the act of applying the voltage across the oxide to cause tunneling damages the oxide. To reduce the stress induced leakage current that occurs due to the damage to the oxide, the minimum oxide thickness should be increased from the lower bound of about 5 nm to about 8 nm.

As integrated circuit (IC) dimensions are scaled below 0.25 μm, the operating voltages of CMOS circuits have also been scaled down. Unfortunately, it has been demonstrated that the applied voltages typically employed to inject electrons onto and tunnel off of the floating gate of an EEPROM (electrically erasable programmable read only memory) are not capable of being scaled down to the same degree as the operating voltages of below 0.25 μm processes. Yoshikawa, K. et al, "Flash EEPROM Cell Scaling Based on Tunnel Oxide Thinning Limitations", Symp. on VLSI Technol. Dig. Tech. Papers, pp. 79–80 (1991); Yamaguchi, Yoshiko, et al, "ONO Interpoly Dielectric Scaling Limit for Non-volatile Memory Devices", Symp. on VLSI Technol. Dig. Tech. Papers, pp. 85–86 (1993); Caywood, J. M. and Gary Derbenwich "Nonvolatile Memories", in ULSI Device Technology, ed. S. M. Sze and C. Y. Chang, in press.

Because charge leakage through the tunnel oxide limits the scaling of the tunnel oxide thickness and the physics of the phenomena used for injecting charge onto the floating gate limit the scaling of the voltages, it is well understood in the art that the mismatch between the minimum physical dimensions and minimum operating voltages of the floating gate nonvolatile memories and the surrounding CMOS logic technology is becoming increasingly acute. Accordingly, what is needed are new apparatus and methods for charging and discharging the floating gate so that the physical dimensions and required voltages can be reduced to values more in line with CMOS logic technology.

BRIEF DESCRIPTION OF THE INVENTION

In the present invention, a tunneling charge injector that includes a conducting injector electrode, a grid insulator disposed adjacent to the conducting injector electrode, a grid electrode disposed adjacent to the grid insulator, a retention insulator disposed adjacent to the grid electrode, and a floating gate electrode disposed adjacent to the retention insulator may be employed to inject charge from the conducting injector electrode onto the floating gate.

According to one aspect of the present invention, the tunneling charge injector may be employed to inject both electrons and holes onto the floating gate electrode. Electrons are injected onto the floating gate when the conducting injector electrode is sufficiently negatively biased with respect to the grid electrode and the floating gate is biased to collect electrons from the grid. Holes are injected onto the floating gate when the conducting injector electrode is sufficiently positively biased with respect to the grid electrode and the floating gate is biased to collect holes from the grid.

According to another aspect of the present invention, separate tunneling electron and hole injectors may be employed to inject electrons or holes onto the floating gate. Electrons are injected onto the floating gate when the conducting injector electrode is sufficiently negatively biased with respect to the grid electrode and the floating gate is biased to collect electrons from the grid. Holes are injected onto the floating gate when the conducting injector electrode is sufficiently positively biased with respect to the grid electrode and the floating gate is biased to collect holes from the grid.

According to another aspect of the present invention, the tunneling charge injector may be employed in a nonvolatile memory cell having a nonvolatile memory element with a floating gate such as a floating gate MOS transistor. In the nonvolatile memory cell, the floating gate of the tunneling charge injector is coupled to or forms a part of the floating gate of the nonvolatile memory element. The tunneling charge injector is employed to inject charge onto the floating gate of the nonvolatile memory element.

According to another aspect of the present invention, separate tunneling electron and hole injectors may be employed in a nonvolatile memory cell having a nonvolatile memory element with a floating gate such as a floating gate MOS transistor. In the nonvolatile memory cell, the floating gates of the separate tunneling electron and hole injectors are coupled to or form a part of the floating gate of the nonvolatile memory element The tunneling electron injector is employed to inject electrons onto the floating gate of the nonvolatile memory element, and the tunneling hole injector is employed to inject holes onto the floating gate of the nonvolatile memory element.

According to another aspect of the present invention, a memory device includes an array of nonvolatile memory cells wherein each of the memory cells comprises a nonvolatile memory element with a floating gate such as a floating gate MOS transistor and a tunneling charge injector having a floating gate that is either coupled to the floating gate of the nonvolatile memory element or forms a portion of the floating gate of the nonvolatile memory element.

According to another aspect of the present invention, a memory device includes an array of nonvolatile memory cells wherein each of the memory cells comprises a nonvolatile memory element with a floating gate such as a floating gate MOS transistor, a tunneling electron injector having a floating gate that is either coupled to the floating gate of the nonvolatile memory element or forms a portion of the floating gate of the nonvolatile memory element, and a tunneling hole injector having a floating gate that is either coupled to the floating gate of the nonvolatile memory element or forms a portion of the floating gate of the nonvolatile memory element.

BRIEF DESCRIPTION OF THE DRAWINGS

FIGS. 1a, 1b and 1c are, respectively, electrical schematic symbols a for tunneling charge injector, a tunneling electron injector, and a tunneling hole injector, in accordance with the present invention.

FIGS. 2a, 2b and 2c are, respectively, band diagrams of a tunneling charge injector in the (a) flat band condition and (b) under bias for injection of electrons and (c) holes in accordance with a specific embodiment of the present invention.

FIGS. 9a, 9b, 10a–10b, 11a–11d, 12a–12d, 13a–13d, 14a–14d, 15a–15d, 16a–16d, 17a–17e, and 18a–18e illustrate selected steps in the fabrication of a portion of the array of nonvolatile memory elements depicted in FIG. 8 in accordance with a specific embodiment of the present invention.

DETAILED DESCRIPTION OF A PREFERRED EMBODIMENT

Figure 3A:
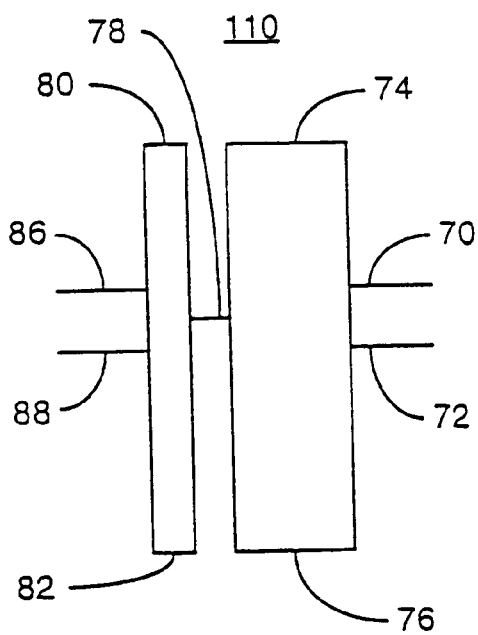
FIGS. 3a and 3b are, respectively, band diagrams of a tunneling electron injector in the (a) flat band condition and (b) under bias for injection of electrons in accordance with a specific embodiment of the present invention.

Those of ordinary skill in the art will realize that the following description of the present invention is illustrative only and not in any way limiting. Other embodiments of the invention will readily suggest themselves to such skilled persons having the benefit of this disclosure.

In FIG. 1a, the circuit symbol for a tunneling charge injector 10, according to the present invention, suitable for delivering either electrons or holes to the floating gate of a nonvolatile memory is illustrated. In FIG. 1b, the circuit symbol for a tunneling electron injector 30, according to the present invention, suitable for delivering electrons to the floating gate of a nonvolatile memory is illustrated. In FIG. 1c, the circuit symbol for a tunneling hole injector 50, according to the present invention, suitable for delivering holes to the floating gate of a nonvolatile memory is illustrated. The implementation of the tunneling charge injector 10, tunneling electron injector 30 and tunneling hole injector 50, according to the present invention, will be discussed in detail below.

The tunneling charge injector 10 has a conducting injector electrode 12, a grid electrode 14, and a floating gate electrode 16, sometimes referred to herein as a floating gate. Disposed between the injector electrode 12 and the grid electrode 14 is a grid insulator 18, and disposed between the grid electrode 14 and floating gate electrode 16 is a retention insulator 20. The tunneling electron injector 30 has a conducting injector electrode 32, a grid electrode 34, and a floating gate electrode 36. Disposed between the injector electrode 32 and the grid electrode 34 is a grid insulator 38, and disposed between the grid electrode 34 and floating gate electrode 36 is a retention insulator 40. The tunneling hole injector 50 has a conducting injector electrode 52, a grid electrode 54, and a floating gate electrode 56. Disposed between the injector electrode 52 and the grid electrode 54 is a grid insulator 58, and disposed between the grid electrode 54 and floating gate electrode 56 is a retention insulator 60.

In the tunneling charge injector 10, a bias is applied so that charge is emitted from the conducting injector electrode 12 with sufficient energy to pass through grid insulator 18, grid electrode 14, and a retention insulator 20 to be collected by the floating gate electrode 16. To charge the floating gate electrode 16, electrons are injected by tunneling into the grid electrode 14 from which they are collected on the floating gate 16, and to discharge the floating gate electrode 16, holes are injected by tunneling into the grid electrode 14 from which they are collected on the floating gate 16.

In the tunneling electron injector 30, a bias is applied so that electrons are emitted from the conducting injector electrode 32 with sufficient energy to pass through grid insulator 38, grid electrode 34, and the retention insulator 40 to be collected by the floating gate electrode 36.

In the tunneling hole injector 50, a bias is applied so that holes are emitted from the conducting injector electrode 52 with sufficient energy to pass through grid insulator 58, grid electrode 54 and the retention insulator 60 to be collected by the floating gate electrode 56.

A tunnel emission amplifier implemented with a triode structure that is somewhat similar to the tunneling charge injector 10, the tunneling electron injector 30, and the tunneling hole injector 50 was disclosed by Mead, "The Tunnel Emission Amplifier", Proceedings of the IRE, Vol. 48, pp. 359–361 (March 1960). In the triode structure described by Mead, a first Al layer forms an emitter, a layer of $Al_2O_3$ is disposed on the emitter, a thin second Al layer disposed on the $Al_2O_3$ layer forms a base, a layer of SiO formed on the thin Al base, and a third Al layer disposed on the layer of SiO forms a collector. In operating this structure as a tunnel emission amplifier, a bias is applied from the emitter to the base to tunnel electrons from the emitter to the base through the first insulating layer. Metals were chosen as a carrier source because the electron densities are very large.

As will be described below, the thicknesses and physical properties of the grid insulator 18 and retention insulator 20 can be separately optimized for the tunnel injection and charge retention functions, and the conducting injector electrode 12 and floating gate electrode 16 can also be chosen to optimize the efficiency of the injection phenomenon. Further, the tunneling charge injector 10 can be used to provide both holes and electrons to simplify the fabrication process, or the structures for injection and collection of electrons and holes by the tunneling electron injector 30 and tunneling hole injector 50, respectively, can be optimized separately.

Turning now to FIG. 2a, a bandgap diagram of a, tunneling charge injector 10 according to the present invention is illustrated. In this embodiment, the floating gate 16 is composed of silicon having a conduction band edge 70 and a valence band edge 72. Formed next to the floating gate 16 is the retention insulator 20 having a conduction band edge 74 and valence band edge 76. The retention insulator 20 is preferably formed thick enough and with a material having a large enough band gap to effectively keep charges from leaking from the floating gate 16. In the preferred embodiment, the retention insulator 20 is silicon oxide having a thickness of between about 8 nm and about 50 nm, and preferably between about 15 nm and about 20 nm.

The grid electrode 14 is formed adjacent to the retention insulator 20 to serve as an electrode for tunneling, and is preferably tin enough to m e the loss of energy of injected charge carriers, but thick enough to conduct away the charge carriers that lose energy and are thermalized in the grid electrode 14. In the preferred embodiment, a metal with a work function with a fermi level 78 that lies in the middle of the silicon band gap in the flat band condition is chosen for the grid electrode 14. Chromium (Cr), Nickel (Ni), Copper (Cu) and Tungsten (W) are examples of metals that approximately meet this criterion. The grid electrode 14 has a thickness of about 10 nm to about 50 nm thick and is preferably in the range of about 15 nm to about 20 nm.

The grid insulator 18 formed adjacent the grid electrode 14 has a conduction band edge 80 and a valence band edge 82. The grid insulator 18 is silicon dioxide having a thickness in the range of about 3 nm to about 6 nm and preferably in the range of about 4 nm to about 5 nm in this preferred embodiment. The thickness of the grid insulator 18 is selected to permit charge carriers to tunnel through with the application of a modest voltage in the range of about 2 V to about 6 V and preferably in the range of about 3 V to about 5 V across the grid insulator 18.

The conducting injector electrode 12 formed adjacent the grid insulator layer 18 has fermi level 84. In the preferred embodiment, a metal employed in the conducting injector electrode 12 has a work function similar to that of the metal forming the grid electrode 14.

For the embodiment of the tunneling charge injector 10 described with respect to FIG. 2a, the application of a negative bias from the injector electrode 12 with respect to the grid electrode 14, as illustrated in FIG. 2b, will result in electrons tunneling from the injector electrode 12 to the grid electrode 14. When the injector electrode 12 is more than about 3.8 V negative with respect to the grid electrode 14, some of the injected electrons will reach the interface between the grid electrode 14 and the retention insulator 20 with enough energy to surmount the energy barrier of the retention insulator 20. When the potential of the floating gate 16 is positive with respect to the potential of the grid electrode 14, most of the electrons that surmount the energy barrier of the retention insulator 20 will be collected on the floating gate 16. In this manner, the floating gate 16 is charged negatively. A potential of about 0.5 V to about 1 V between the grid electrode 14 and floating gate electrode 16 is sufficient for the collection of electrons on the floating gate electrode 16. It should be appreciated that larger potentials have the beneficial effect of lowering the energy barrier of the retention insulator 20.

As is illustrated in FIG. 2c, when the potentials applied to the tunneling charge injector 10 depicted in FIG. 2a are reversed in polarity, holes can be injected onto the floating gate 16 to charge the floating gate 16 positively. For the preferred embodiment of FIG. 2a, a positive bias of about 5.8 V between grid electrode 14 and injector electrode 12 is required for the injected holes to have enough energy to surmount the grid insulator 18. The magnitude of the bias required between the floating gate electrode 16 and the grid electrode to collect holes injected over the potential barrier of the retention insulator 20 is about 0.5 V to about 1 V. This is similar to the case electron injection. Thus, a total voltage drop of 7 V between the injector electrode 12 and the floating gate electrode 16 is sufficient to cause holes to be injected onto the floating gate electrode 16.

The injection efficiency, i.e. the fraction of carriers injected from the injector electrode 12 that reach the floating gate 16, is expected to be between 0.1% and 1% for an electron injector and perhaps an order of magnitude lower for a hole injector. These efficiencies are several orders of magnitude greater than those of a typical channel hot electron flash EEPROM.

By implementing the injector conductor 12 with materials other than those disclosed with respect to the embodiment of FIG. 2a, the injection efficiencies may be improved and the required applied voltages may be reduced.

Figure 3B:
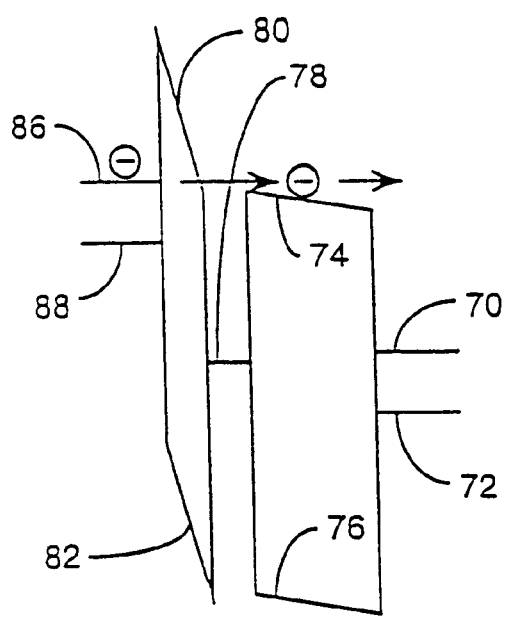

FIG. 3a illustrates a conduction band diagram for tunneling electron injector 30 as depicted in FIG. 1b. The conduction band diagram of FIG. 3a is similar to that of FIG. 2a, except that the injector electrode 32 is a heavily doped n-type silicon having a conduction band edge 86 and valence band edge 88. In FIG. 3b, the structure depicted in FIG. 3a, has been biased to inject electrons. In contrast to the structure of FIG. 2a, because electrons can be injected from the conduction band edge 86, the bias between the injector electrode 32 and the grid electrode 34 can be reduced to about 3.2 V. Moreover, due to the band gap of silicon, there are essentially no states available for tunneling that are more than 1 eV below the conduction band edge. This reduces the tunneling probability of lower energy electrons. This is advantageous because these lower energy electrons do not effectively contribute to the charge on the floating gate electrode 36, but rather only add to the current in the grid electrode 34.

Figure 4A:
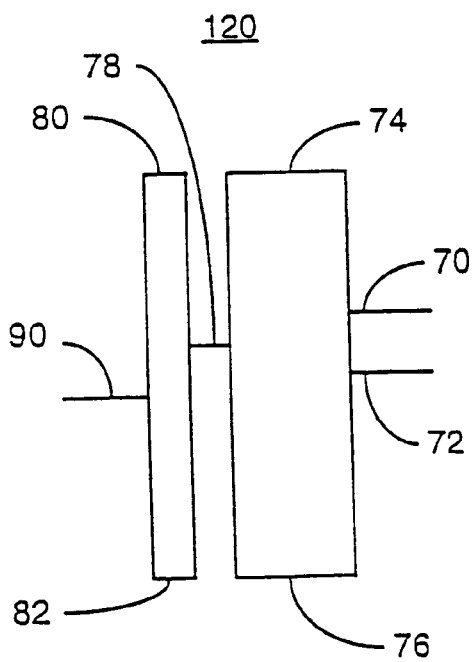
FIGS. 4a and 4b are, respectively, band diagrams of a tunneling hole injector in the (a) flat band condition and (b) under bias for injection of holes in accordance with a first embodiment of the present invention.
Figure 4B:
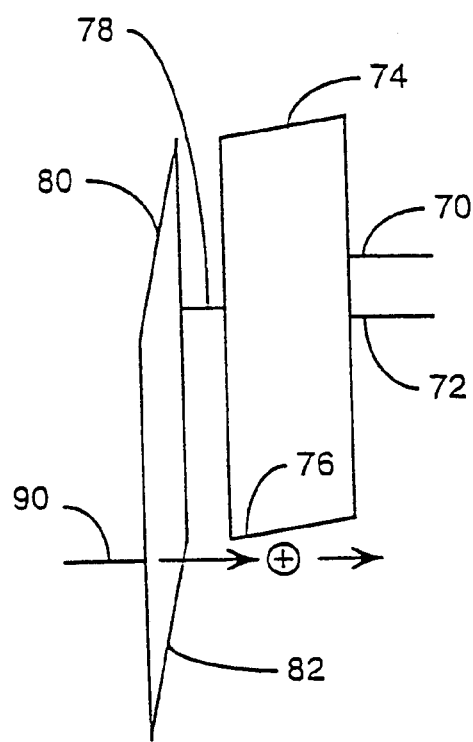

FIG. 4a illustrates a conduction band diagram for tunneling hole injector 50 as depicted in FIG. 1c. The conduction band diagram of FIG. 4a is similar to that of FIG. 2a, except that the injector electrode 52 is a metal with a large work function such as Platinum (Pt) having a fermi level 90. Further, Pt may be employed as a metal in the grid electrode 54 in addition to the metals disclosed for the grid electrode in FIG. 2a. In FIG. 4b, the structure depicted in FIG. 4a, has been biased to inject holes over the barrier of retention insulator into the valence band of the retention insulator. For this structure, the bias required for hole injection over the retention insulator with respect to the flat band condition is reduced to about 4.4 V.

Figure 5A:
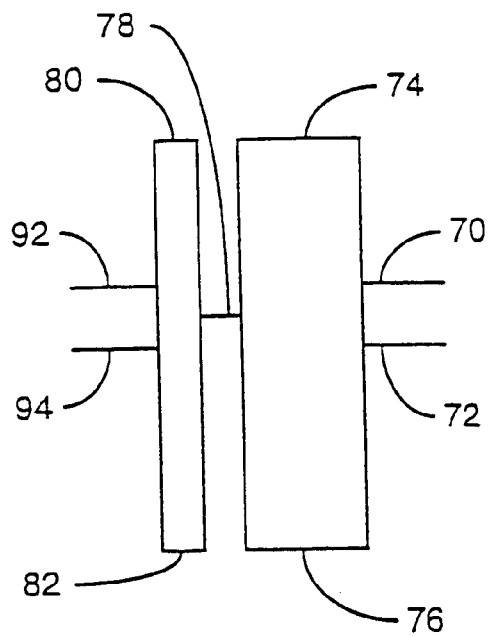
FIGS. 5a and 5b are, respectively, band diagrams of a tunneling hole injector in the (a) flat band condition and (b) under bias for injection of holes in accordance with a second embodiment of the present invention.
Figure 5B:
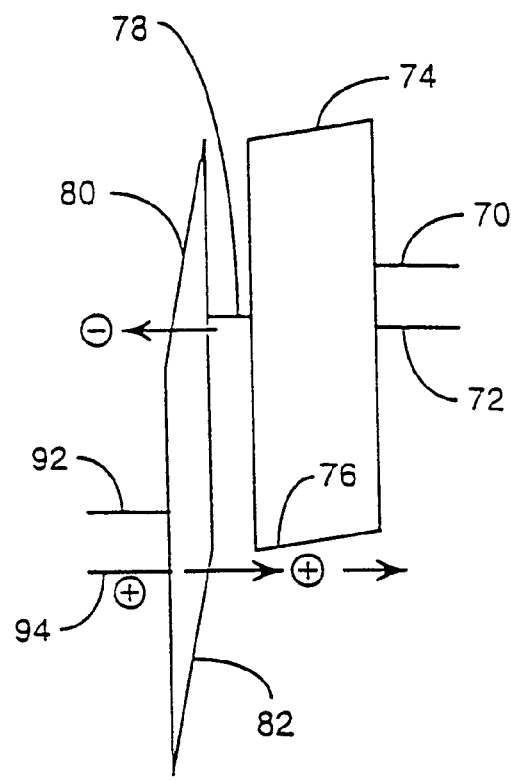

FIG. 5a illustrates a conduction band diagram for an alternative embodiment of the tunneling hole injector 30 as depicted in FIG. 1c. The conduction band diagram of FIG. 5a is similar to that of FIG. 2a, except that the injector electrode 52 is a heavily doped p-type silicon having a conduction band edge 92 and a valence band edge 94. In FIG. 5b, the structure depicted in FIG. 5a, has been biased to inject holes. The bias depicted in FIG. 5b for injection of holes into the conduction band of the retention insulator is about 4.6 V. Similar to n-type silicon electron injector depicted in FIG. 3a, there is a band gap of greater than 1 eV above the valence band edge for which there are essentially no states from which low energy holes can tunnel into the grid electrode 54 and contribute to the grid current. This leads to increased efficiency of hole injection onto the floating gate electrode 56.

Furthermore as depicted in FIG. 5b the material of the grid electrode may be selected to improve the efficiency of the tunneling hole injector 50. One consideration in selecting the material is the range of the hot carrier in the grid material. It is desirable that this range be maximized. Another consideration is to decrease the tunneling of unwanted electrons. As illustrated in FIG. 5b, while tunneling holes from the valence band of the p-type silicon emitter, electrons will tunnel from near the fermi level 96 in the grid electrode 54 into the conduction band in the injector electrode 52. This can be greatly reduced by using a grid material that has a larger work function.

From the discussion above, it should now be appreciated by those of ordinary skill in the art that the selection of the insulating layers may also increase the injection efficiency. For example, if present efforts to develop silicon nitride with a low density of traps so that Poole-Frenkel conduction is suppressed are successful, nitride might be beneficially employed for the retention insulator because it has a lower energy barrier to injection of both electrons and holes than silicon dioxide. Furthermore, although silicon dioxide is preferably employed as the grid insulator, it should be appreciated by those of ordinary skill in the art that other wide band gap insulators, such as aluminum oxide may be suitably employed as the grid insulator.

It should also be appreciated by those of ordinary, skill in the art that a semiconductor may be employed as the grid material. It is appreciated by those of ordinary skill in the art that electron-electron scattering is the principle loss mechanism for hot electrons in metal. The range of electrons with a few electron volts of energy may be longer in semiconductors due to a lower carrier concentration. A longer mean free path would give rise to a higher efficiency and thereby provide a lower grid current that is lower than for metals. The higher efficiency offsets the larger resistivity effects found in a semiconductor in comparison to a metal.

Figure 6A:
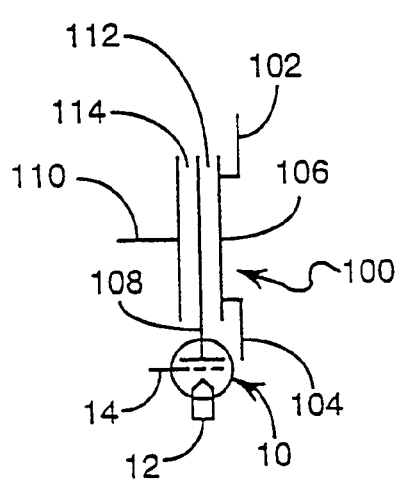
FIG. 6a is an electrical schematic diagram illustrating a tunneling charge injector coupled to a floating gate MOS transistor to form a nonvolatile memory element in accordance with a specific embodiment of the present invention.
Figure 6B:
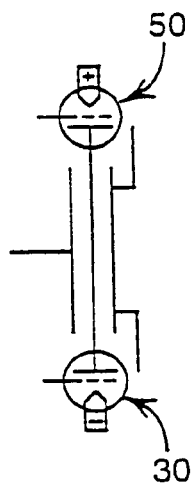
FIG. 6b is an electrical schematic diagram illustrating a tunneling electron injector and a tunneling hole injector coupled to a floating gate MOS transistor to form a nonvolatile memory element in accordance with a specific embodiment of the present invention.

In FIGS. 6a and 6b, a typical floating gate MOS transistor 100 having a source 102 and a drain 104 formed in a semiconductor body 106, a floating gate 108, a control gate 110, and first and second insulating layers 112 and 114 is illustrated. In the floating gate MOS transistor 100, the semiconductor body 106 has a doping of a first type, and the source 102 and drain 104 having a doping of a second type. The source 102 and drain 104 are spaced apart to form a channel region. The floating gate 108 is disposed above the channel region, and the first insulating layer 112 forming a floating gate dielectric is disposed between the floating gate 108 and the semiconductor body 106. The second insulating layer 114 forming a control gate dielectric is disposed between the control gate 110 and the floating gate 108. In most high density floating gate nonvolatile memory arrays the control gate 110 lies at least partially over the floating gate 108, but is separated from it by the second insulating layer 114.

In the operation of the floating gate MOS transistor 100, the potential on the floating gate 108 controls the current flow between the source 102 and drain 104 as is well known to those of ordinary skill in the art. The control gate 110 is an electrode that is capacitively coupled to the floating gate 108 in order to be able to control the current flow through the floating gate MOS transistor 100 with an external bias.

In FIG. 6a, the tunneling charge injector 10 is coupled to the floating gate 108 of the floating gate MOS transistor 100. In FIG. 6b, the tunneling electron injector 30 and the tunneling hole injector 50 are both coupled to the floating gate 108 of the floating gate MOS transistor 100. In embodiments according to the present invention the floating gate 108 of the floating gate MOS transistor 100 forms the floating gate electrodes 16, 36 and 56 of the tunneling charge injector 10, the tunneling electron injector 30 and the tunneling hole injector 50, respectively.

It will be readily appreciated by those of ordinary skill in the art that many subtle arrangements of the elements of the floating gate MOS transistor 100 are well known. The floating gate MOS transistor 100 illustrated in FIGS. 6a and 6b is a generic depiction to illustrate that the tunneling charge injector 10, tunneling electron injector and tunneling hole injector 50 of the present invention may be coupled to various alternative embodiments of floating gate MOS transistors known to those of ordinary skill in the art.

Figure 7:
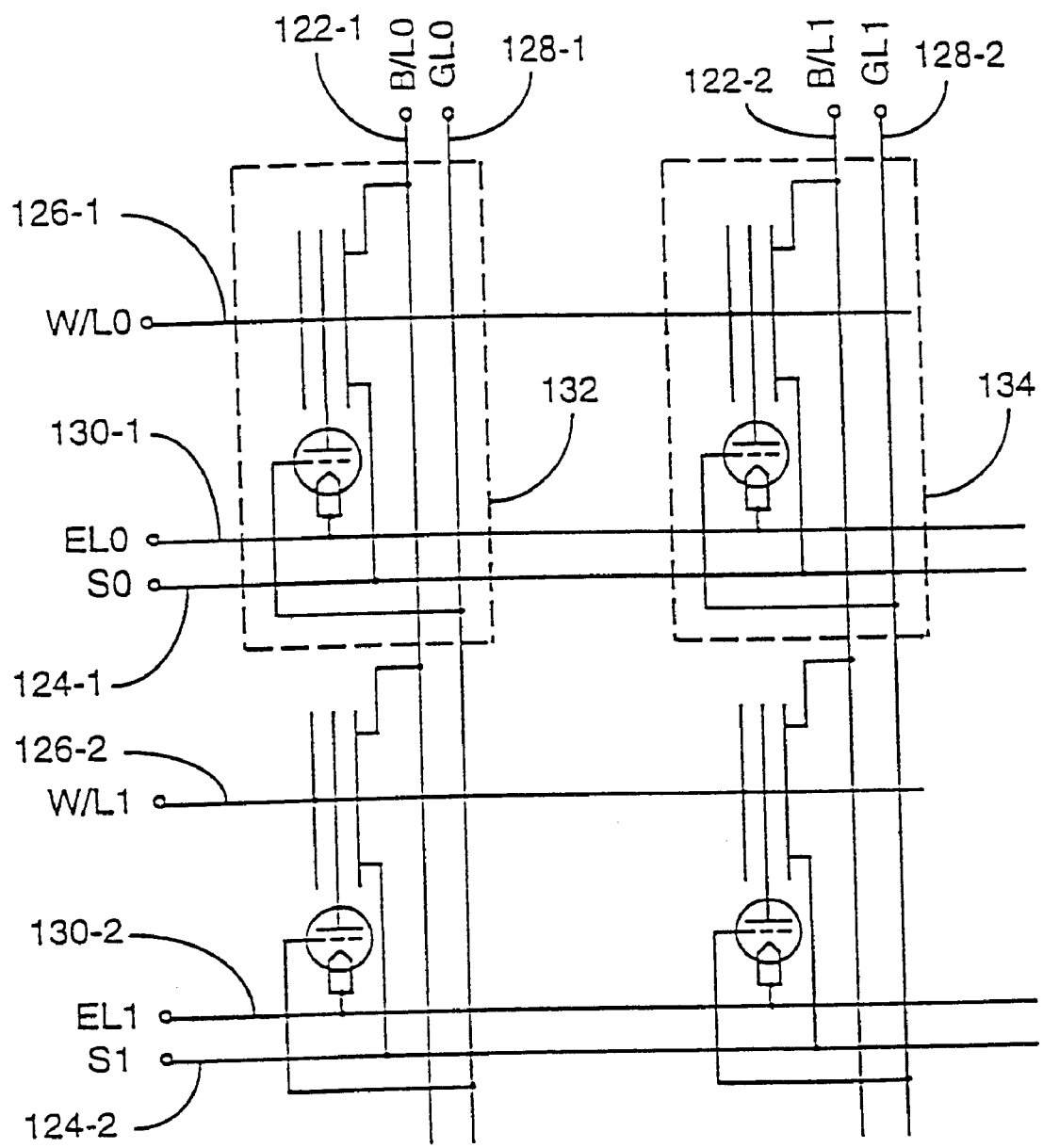
FIG. 7 is an electrical schematic diagram illustrating a portion of an array of the nonvolatile memory elements depicted in FIG. 6a in accordance with a specific embodiment of the present invention.

FIG. 7 illustrates a portion of a nonvolatile memory array 120 according to the present invention. Each memory element in the array 120 is a floating gate MOS transistor 100 coupled to a tunneling charge injector 10 as depicted in FIG. 6a. Although the floating gate MOS transistors 100 are n-channel, those of ordinary skill in the art will readily appreciate that they could also be p-channel. Each memory element is connected to a bit line 122, a source line 124, a word line 126, a grid line 128, and an injector line 130. In the portion of a nonvolatile memory array 120, four cells are arranged as two rows and two columns. There are two bit lines 122-1 and 122-2, two source Lines 124-1 and 124-2, two word lines 126-1 and 126-2, two grid lines 128-1 and 128-2, and two injector lines 130-1 and 130-2.

In a preferred embodiment, the word line 126 is separated from the floating gate of the floating gate MOS transistor 100 on the top and two sides in the word line direction by an ONO layer with an effective oxide thickness of about 20 nm, the tunneling charge injector 10 is formed on one of the other two sides of the floating gate with the grid separated from the floating gate with an oxide layer of about 20 nm thick. The gate oxide the floating gate MOS transistor 100 is about 6 nm thick, and the floating gate is 0.1 $\mu$m long, 0.1 $\mu$m wide, and 0.15 nm high. Accordingly, the floating gate MOS transistors 100 have a threshold voltage of about 0.4 to about 0.5 V.

In some array architectures, some of the lines of the same type may be connected in parallel. For example, the source lines 124 are commonly connected in parallel to form one equipotential array source. It is also possible for different types of lines to be connected together. For example, in some array configurations, the source lines 124 and injector lines 130 in the same row might share the same potential. It is preferred that the grid and injector lines 128 and 130, respectively, be orthogonal to each other.

During a read operation performed on the memory cells of the array 120, the grid and injector lines 128 and 130, respectively, are biased so that a flat band condition exists between them to prevent current flow. For the embodiment of the tunneling charge injector 10 of FIG. 2a employed with MOS floating gate transistor 100 that is an N-channel device, the source lines 124, unselected word lines 126, grid lines 128, and injector lines 130 are biased at ground during the read operation. The selected word line 130 is biased at a reference potential of about 2..5 V.

With these conditions, the programming bias, erase bias and threshold of a neutrally charged floating gate are chosen so that both programmed and erased floating gate MOS transistors in the array 120 are nonconducting when the word line 130 to which they are coupled is grounded. The erased floating gate MOS transistors in the array 120, but not the programmed transistors floating gate MOS transistors in the array 120, should be conducting when the selected word line 130 is biased at the selected reference potential of about 2.5 V. As is well understood by those of ordinary skill in the art, the threshold of the neutrally charged floating gate of typically about 0.4 V to about 0.5 V is related to the floating gate oxide thickness, floating gate work function, and the doping of the channel regions in the floating gate MOS transistor.

To selectively program the cell in the array 120 indicated by reference numeral 132, injector line 130-1 is biased at about −3 V, the grid line 128-1 is biased at about +1 V, and the word line 126-1 is biased at about 5 V. Under these conditions, the grid electrode 14 is about 4 V positive with respect to the injector electrode 12. This bias provides some electrons with enough energy to surmount the energy barrier between the grid conductor 14 (sometimes referred to as a grid electrode) and the retention insulator 20. Because the word line 126-1 is biased at 5 V, the floating gate 16 is coupled at a positive potential with respect to the grid electrode 14 and electrons are collected.

For an unselected memory cell, indicated at reference numeral 134, the unselected grid line 128-2 is biased at −1 V so that the potential between injector electrode 12 and the grid electrode 14 is too small for essentially any electrons to surmount the energy barrier between the grid conductor 14 and the retention insulator 20. The unselected injector line 130-2 is also biased at −1 V. As a result, for memory cells on unselected rows, but having a selected bit line, there is 2 V bias between the injector electrode 12 and the grid electrode 14. The word line bias for such a memory cell is such as to repel any electrons that are injected over the barrier between the grid conductor 14 and the retention insulator 20. Finally, the memory cells on unselected word and bit lines, 126 and 122, respectively, experience no bias between the injector electrode 12 and grid electrode 14.

An erase on the memory cells of the array 120 can be performed on either an entire row of memory cells or on a single memory cell. In row selective erase case, the grid lines 128 are all biased to about 6 V, the injector line 130 of the selected row biased at about ground, and the word line 126 of the selected row is biased at about −2 V. On the unselected rows, the injector lines 130 are biased at about 6 V to prevent current between the injector lines 130 and the grid lines 130. If desired, the word lines 126 may also be biased to about 3 V to reduce the potential between the grid lines 130 and the floating gates 16 on the unselected word lines 126. It should be appreciated that the retention insulator 20 may be made thick enough to preclude significant leakage of charge between grid electrode 14 and floating gate 16 even with a potential of about 4 V to about 5 V between grid electrode 14 and floating gate 16 so that the word lines 126 on unselected rows may be grounded.

In the single cell select erase mode, the grid lines 128 and injector lines 130 of the unselected columns and rows are biased at about 4 V to lower the potential between the injector electrode 12 and grid electrode 14 below the level necessary to provide sufficient energy to the injected holes for surmounting the energy barrier between the fermi level in the grid electrode 14 and the valence band edge in the retention insulator 20.

Figure 8:
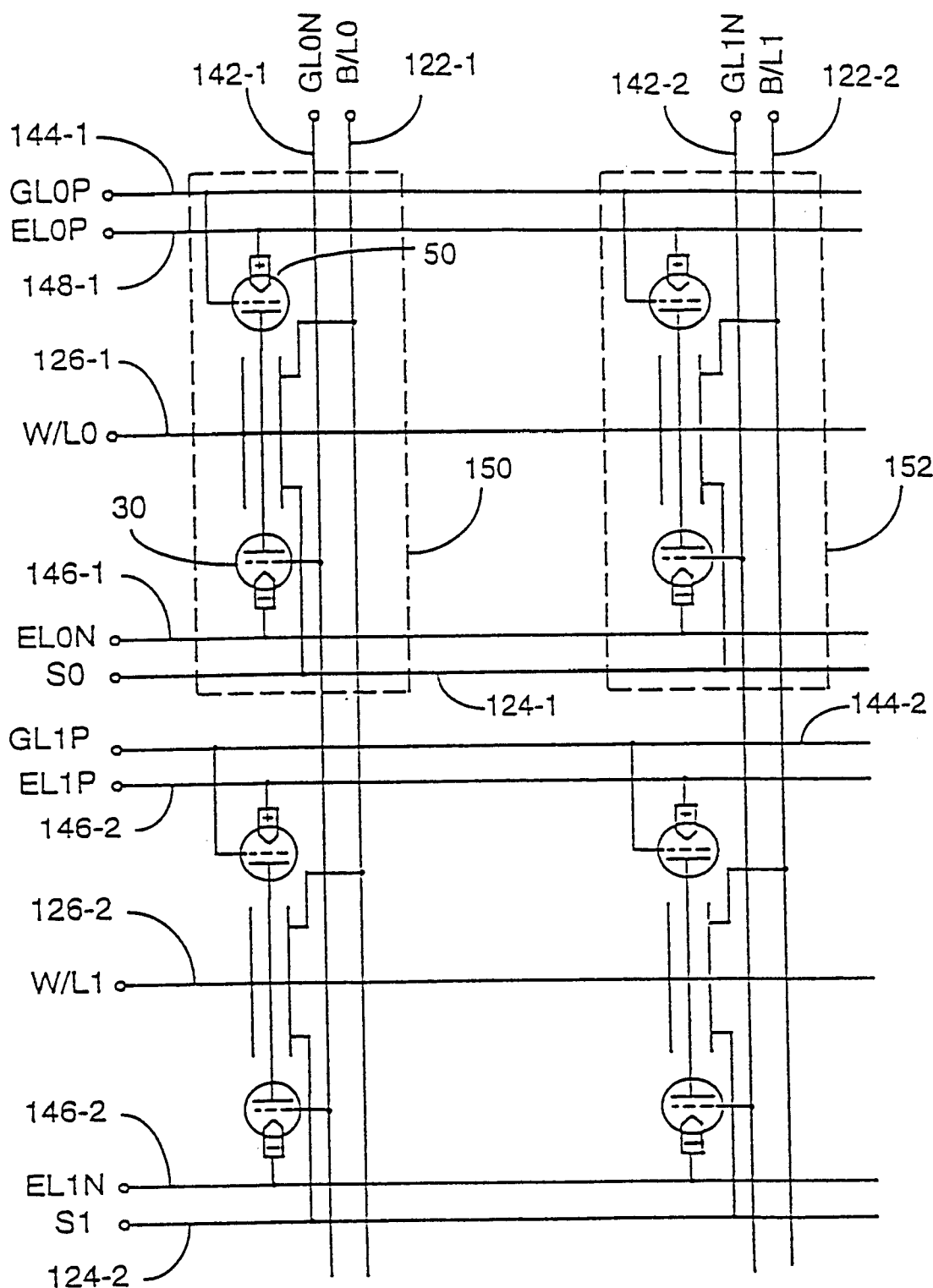
FIG. 8 is an electrical schematic diagram illustrating a portion of an array of nonvolatile memory elements depicted in FIG. 6b in accordance with a specific embodiment of the present invention.
Figures 13A, 13B, 13C:
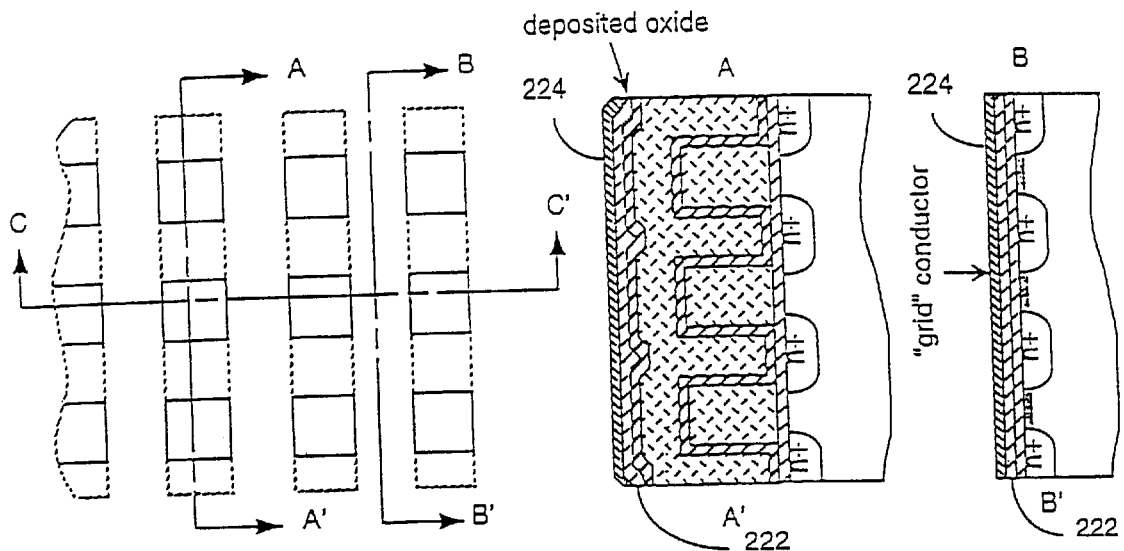
Figure 13D:
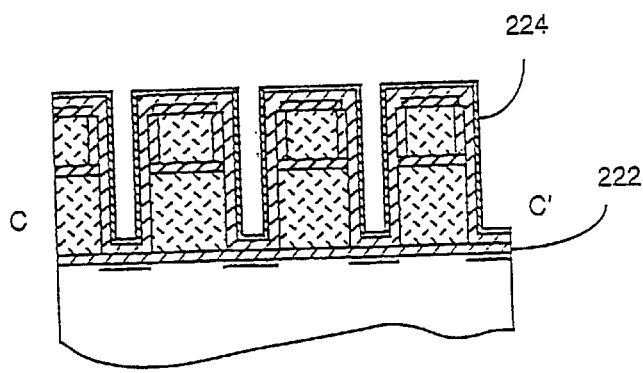
Figure 15A:
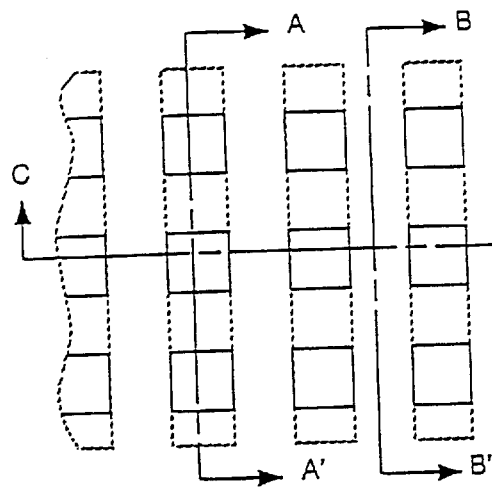
Figure 15B:
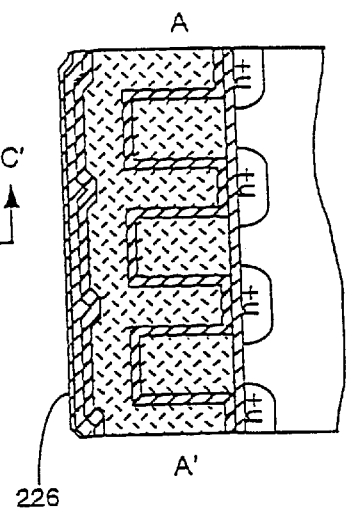
Figure 15C:
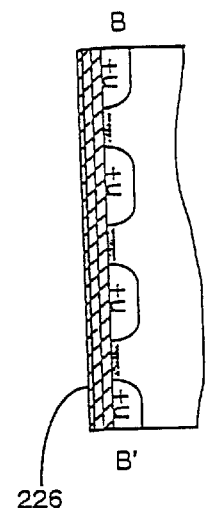
Figure 15D:
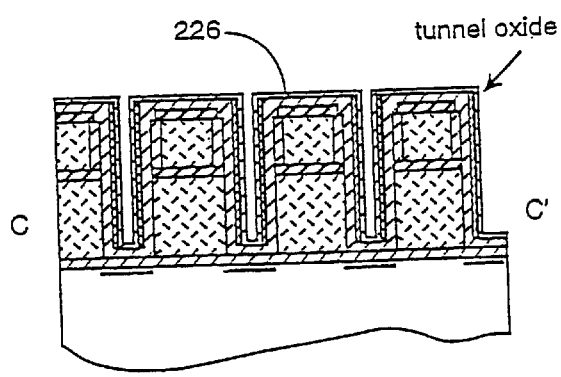
Figures 16A, 16B, 16C:
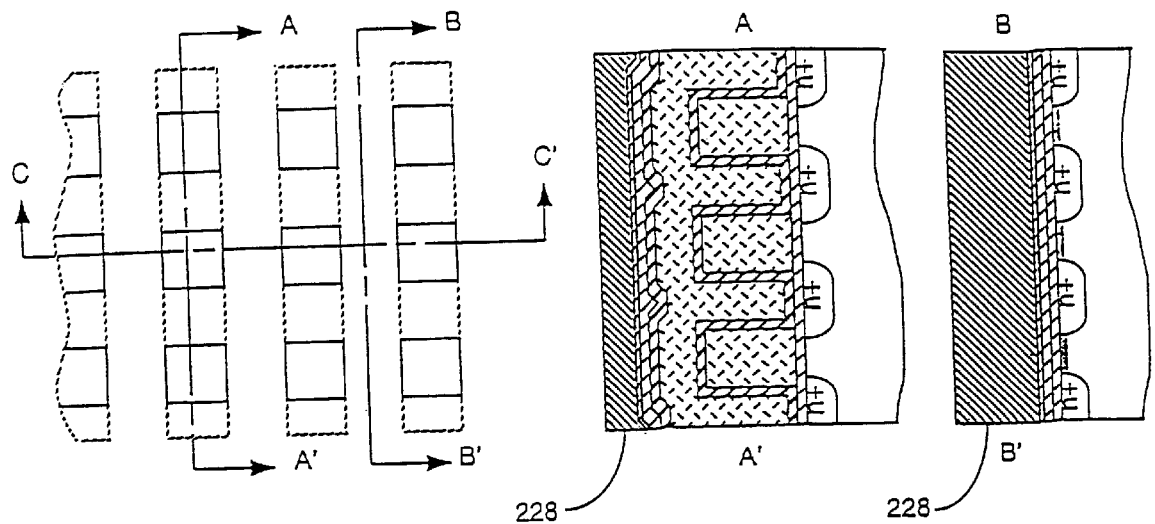
Figure 16D:
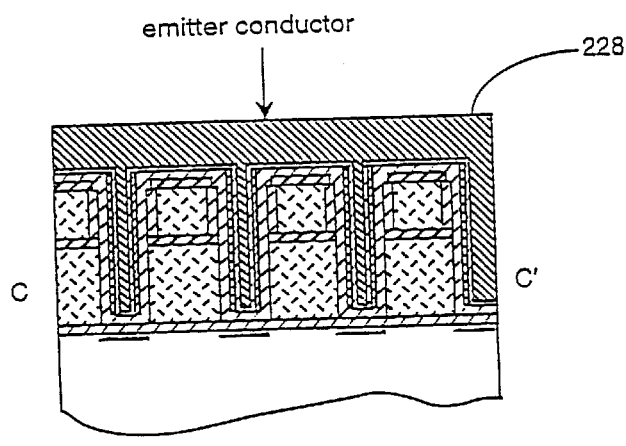
Figure 17A:
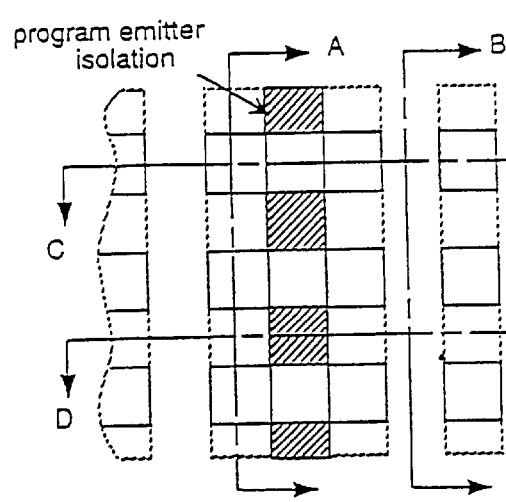
Figures 17B, 17C:
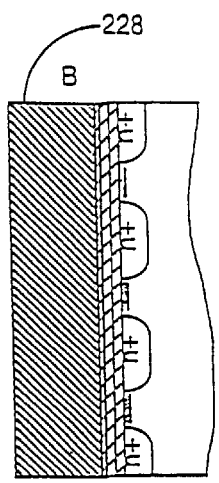
Figure 17D:
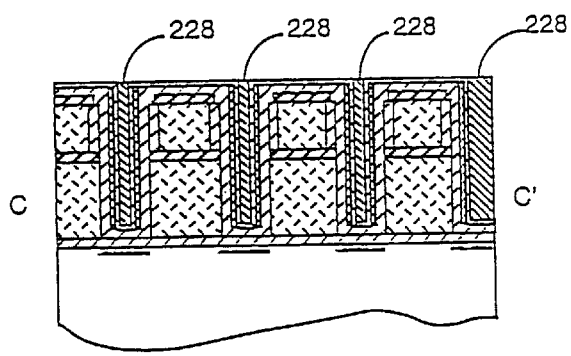
Figure 17E:
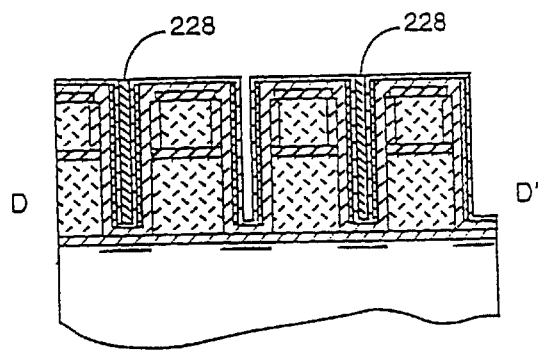

FIG. 8 illustrates a portion of a nonvolatile memory array 140 according to another embodiment of the present invention. Each memory element in the array 140 is a floating gate MOS transistor 100 coupled to a tunneling electron injector 30 and tunneling hole injector 50 as depicted in FIG. 6b. Although the floating gate MOS transistors 100 are n-channel, those of ordinary skill in the art will readily appreciate that they could also be p-channel. Each memory element is connected to a bit line 122, a source line 124, a word line 126, first and second grid lines 142 and 144, and electron and hole injector lines 146 and 148. In the portion of a nonvolatile memory array 140, four cells are arranged as two rows and two columns. There are two bit lines 122-1 and 122-2, two source lines 124-1 and 124-2, two word lines 126-1 and 126-2, two first grid lines 142-1 and 142-2, two second grid lines 144-1 and 144-2, two first injector lines 146-1 and 146-2, and two second injector lines 148-1 and 148-2.

In a preferred embodiment, the word line 126 is separated from the floating gate of the floating gate MOS transistor 100 on the top and two sides in the word line direction by an ONO layer with an effective oxide thickness of about 20 nm, the tunneling electron injector 30 and tunneling hole injector 50 are formed on opposing faces of the floating gate with the grids separated from the floating gate with an oxide layer of about 20 nm thick. The gate oxide the floating gate MOS transistor 100 is about 6 nm thick, and the floating gate is 0.1 $\mu$m long, 0.1 $\mu$m wide, and 0.15 nm high. Accordingly, the floating gate MOS transistors 100 have a threshold voltage of about 0.4 to about 0.5 V.

In the erase mode of array 140, each of the memory cells is erased simultaneously by applying 5 V to the hole injector lines 148 and grounding all other lines in the array. Alternatively, the hole injector lines 148 may be biased at about 3 V, the word lines 126 biased at −3 V, and all of the other lines at about −1.8 V. With this set of biasing conditions, the maximum magnitude of any bias is reduced to 3 V. It should now be appreciated by those of ordinary skill in the art that there are a variety of sets of other bias conditions that will erase the cells of the array 140.

To selectively program the cell in the array 140 indicated by reference numeral 150, 4 V is applied to word line 126-1, a bias of –2.5 V is applied to electron injector line 146-1, 1 V is applied to the first grid line 142-1, and 3 V is applied to the hole injector lines 148 and the two second grid lines 144-1 and 144-2. To inhibit electron injection to unselected cells, the unselected electron injector line 146-2 is biased at 0 V and the unselected first grid line 142-2 is biased at –1 V. Under these conditions, the unselected cells have ±1 V applied between grid line 142-2 and electron injector line 146-2. These potentials are far too low to cause electron injection over the energy barrier between the grid conductor 34 and the retention oxide 40. The low biases applied between grid line 142-2 and electron injector line 146-2 permit only relatively small currents to flow between these lines in the unselected cells.

As has been discussed above, there are a great number of combinations of materials that can be used in forming the injection structures which lie within the scope of this invention. The fabrication of one particular embodiment is now described to illustrate how this invention can be implemented within an integrated circuit fabrication process using standard production techniques. In this particular embodiment, the MOS memory transistors are n-channel devices. It should be appreciated, however, that they could other wise be p-channel devices.

In FIGS. 9a and 9b, a silicon body 200 is shown that is doped p-type uniformly in the direction extending along the surface of the wafer in the area of the array. A thin oxide 204 that forms the gate of the floating gate MOS memory transistor in disposed on the surface of the silicon body 200. Because oxide 204 is not exposed to high electric fields during operation, stress induced leakage current will not be generated and the gate oxide can be scaled toward the intrinsic limit of about 5 nm for retention. A layer of silicon is deposited on the oxide 204 and patterned with known means to form parallel traces 206. The silicon body 200 is implanted with an n-type dopant, preferably an n-type dopant with low rate of thermal diffusion such as Arsenic (As) or Antimony (Sb), to form doped regions 202 in the spaces between the silicon traces 206. The dopant may serve to dope the silicon traces 206, but the traces 206 serve to mask the regions under the traces 206.

In FIGS. 10A and 10B, after the implant is performed, an oxide/nitride/oxide, ONO, dielectric 208 is formed by one of several methods known in the art. It is preferred that the method employed does not expose the n-type implant 202 to high temperature treatment. A second layer of silicon 210 is deposited and doped either in situ or subsequent to deposition. A layer of silicon nitride is deposited on the second layer of silicon 210 and capped with a layer of deposited oxide to form the sandwich layer 212. The oxide layer in the sandwich layer 212 should be substantially thicker than the top layer of oxide in the ONO stack, preferably about 50 nm thick.

In FIGS. 11a through 11d, the sandwich layer 212 and underlying silicon layer 210 are then patterned into a series of parallel traces 218 that run perpendicular to the traces 206. A thin layer of silicon oxide 216, preferably about 20 nm thick, is grown on the side walls of the second layer silicon traces 218. The ONO dielectric prevents oxidation of the first layer silicon traces 206 or the underlying silicon body 200 during this process.

In FIGS. 12a through 12d, after the sidewall oxide 216 is grown on the second layer silicon traces, the ONO and underlying first layer silicon traces 206 exposed between the traces 218 of the second layer of silicon are etched away in an anisotropic etch. An implant of boron is made into the exposed regions 220 to raise the thresholds of these regions to provide isolation between the remaining portions of the first layer silicon traces 206 in the direction perpendicular to the second layer silicon traces 218. These remaining portions of the first layer silicon traces 206 form the floating gates of the floating gate memory transistors.

In FIGS. 13a through 13d, a layer of oxide 222 that forms a retention oxide is then deposited and annealed. A grid conductor 224 is deposited on oxide 222. As discussed previously, the grid conductor 224 may be any metal, alloy, or metallic compound that has the appropriate work function, conductivity, and range for "hot" carriers. The grid conductor 224 should be thin enough to allow a desired fraction of hot carriers to pass through without losing energy.

In FIGS. 14a through 14d, the grid conductor 224 is anisotropically etched to leave it only along the sidewalls of the first and second traces of the silicon layers 206 and 218 as is seen in FIG. 14d.

In FIGS. 15a through 15d, a tunnel layer silicon oxide 226 of about 5 nm is deposited so that it covers the grid electrode 224. Although silicon oxide is used in this embodiment, the tunnel insulating layer could be any one of or a combination of silicon nitride, silicon oxide, aluminum oxide, or other such insulator with a high dielectric strength that is compatible with integrated circuit processing technology.

In FIGS. 16a through 16d, the injector conductor 228 is deposited by a method which will fill the space between the silicon traces and provide a reasonably smooth surface. The thickness of the injector conductor 228 should be more than 50% of the spacing between the silicon traces and preferably about 75% of this spacing. For example, if the spacing between the traces is 100 mn, the injector conductor thickness is preferably 75 nm.

In FIGS. 17a through 17e, the material of the injector conductor 228 is then etched back to expose the tops of the traces so that the material of the injector conductor 228 lying in the channels between silicon traces is isolated from material of the injector conductor 228 lying in adjacent channels.

In FIGS. 18a through 18e, an isolating layer 230, of preferably either silicon nitride layer or a sandwich layer of a tin layer of silicon nitride under silicon oxide is deposited and selectively removed from the surface above every other channel. The channels that remain covered implement hole emitters. After the insulator 230 is selectively removed, a conducting layer 232 is deposited that is preferably a thin layer of titanium nitride covered with aluminum. The conducting layer 232 is selectively etched into traces with the aid of a photoresist mask. While the mask is in place, exposed material of the injector conductor 228 is etched from between the traces. The traces are placed so that the islands of material of the injector conductor 228 contacting the conducting traces 232 are adjacent to floating gates. These islands are the electron injectors.

In this structure, the second layer silicon traces 218 implement word lines, the diffused regions 202 implement source and drain regions of the floating gate MOS memory transistors. The hole emitters run along the word lines so that individual word lines, blocks of word lines or an entire array can be erased simultaneously, depending on the biasing of the grid lines, the injector lines, and the word lines. The duration required to erase a row should be on the order of $\mu$sec. Further, because the traces that set the injector biases for the electron injectors run perpendicular to those that set the bias for associated grids, the electron injectors can be individually addressed to permit the programming of individual cells.

The size of each cell is the minimum pitch in each direction so that the individual cell occupies an area of $4l^2$, wherein l is the minimum feature size. For example, in a technology having a minimum feature size of 0.1 $\mu$m, the cell size would be on the order of 0.01 $\mu m^2$ so that $10^8$ cells could be packed into 1 $mm^2$. Moreover, because the cells can be written with biases of about ±3.5 V, the supporting circuitry can be made compatible with scaled technology.

An additional advantage of this technology is that the carriers that are injected over the retention barrier are fairly tightly bunched in energy. As a result, if the bias across the retention insulator is attractive, carriers will be collected with high efficiency. If the floating gate is charged so that the field across the retention insulator is repulsive, very few carriers will be collected. This permits control of the charging of the potential on the floating gate in bands of a few tenths of a volt so that storing multiple bits per cell is feasible.

While embodiments and applications of this invention have been shown and described, it would be apparent to those skilled in the art that many more modifications than mentioned above are now possible without departing from the inventive concepts herein. The invention, therefore, is not to be restricted except in the spirit of the appended claims.

What is claimed is:

1. A nonvolatile memory cell comprising:
    a floating gate MOS transistor including:
        a semiconductor body having a doping of a first type;
        first and second semiconductor regions having a doping of a second type, said first and second semiconductor regions spaced apart to form a channel region in between said first and second semiconductor regions in said semiconductor body;
        a floating gate disposed above said channel region in said semiconductor body;
        a floating gate dielectric disposed between said floating gate and said semiconductor conductor body;
        a control gate;
        a control gate dielectric disposed between said control gate and said floating gate; and
        a tunneling charge injector including:
            a conducting injector electrode from which charge is emitted;
            a grid insulator disposed adjacent to said conducting injector electrode;
            a grid electrode disposed adjacent to said grid insulator; and
            a retention insulator disposed adjacent to said grid electrode, wherein said floating gate is disposed adjacent to said retention insulator and said tunneling charge injector is disposed along a side of said floating gate and separated therefrom by said grid insulator, said grid electrode and said retention insulator.

2. A nonvolatile memory cell as in claim 1, wherein said floating gate comprises polysilicon.

3. A nonvolatile memory cell as in claim 1, wherein said retention insulator is formed of a layer of silicon oxide having a thickness in a range of about 8 nm to about 50 nm.

4. A nonvolatile memory cell as in claim 1, wherein said grid electrode is thin enough to minimize loss of energy of injected charge carriers and thick enough to conduct away charge carriers that lose energy and are thermalized in said grid electrode.

5. A nonvolatile memory cell as in claim 1, wherein said grid electrode has a thickness in a range of about 10 nm to about 50 nm.

6. A nonvolatile memory cell as in claim 2, wherein said grid electrode comprises a metal having a work function with a fermi level that in a flat band condition lies in approximately the middle of a band gap of said floating gate electrode.

7. A nonvolatile memory cell as in claim 1, wherein said grid electrode is formed of a metal selected from the group consisting of: Cr, Ni, Cu, and W.

8. A nonvolatile memory cell as in claim 1, wherein said grid insulator is formed of a layer of silicon oxide having a thickness in a range of about 3 nm to about 6 nm.

9. A nonvolatile memory cell as in claim 1, wherein said grid insulator has a thickness through which charge carriers will tunnel with application across the grid insulator of a bias in a range of about 2 V to about 6 V.

10. A nonvolatile memory cell as in claim 1, wherein said conducting injector electrode comprises a metal having a work function with a fermi level that in a flat band condition lies in approximately the middle of a band gap of said floating gate.

11. A nonvolatile memory cell as in claim 1, wherein said conducting injector electrode is formed of a metal selected from the group consisting of: Cr, Ni, Cu, and W.

12. A nonvolatile memory cell as in claim 1, wherein application of a negative bias from said injector electrode with respect to said grid electrode will result in electrons tunneling from said conducting injector electrode to said grid electrode.

13. A nonvolatile memory cell as in claim 1, wherein the application of a positive bias from said conducting injector electrode with respect to said grid electrode will result in holes tunneling from said injector electrode to said grid electrode.

14. A nonvolatile memory cell as in claim 1, wherein application of a negative bias from said injector electrode with respect to said grid electrode raises a fermi level of said injector electrode to cause electrons to tunnel into said grid electrode with enough energy to pass into a conduction band of said retention insulator.

15. A nonvolatile memory cell as in claim 1, wherein application of a positive bias from said conducting injector electrode with respect to said grid electrode lowers a fermi level of said injector electrode to cause holes to tunnel into said grid electrode with enough energy to pass into valence band of said retention insulator.

16. A nonvolatile memory cell comprising:
    a floating gate MOS transistor including:
    a semiconductor body having a doping of a first type;
    first and second semiconductor regions having a doping of a second type, said first and second semiconductor regions spaced apart to form a channel region in between said first and second semiconductor regions in said semiconductor body;
    a floating gate disposed above said channel region in said semiconductor body;
    a floating gate dielectric disposed between said floating gate and said semiconductor body;
    a control gate; and
    a control gate dielectric disposed between said control gate and said floating gate;
        a tunneling electron injector including:
            a first conducting injector electrode from which electrons are emitted;

a first grid insulator disposed adjacent to said first conducting injector electrode;

a first grid electrode disposed adjacent to said first grid insulator; and a first retention insulator disposed adjacent to said first grid electrode, wherein said floating gate is disposed adjacent to said first retention insulator and said tunneling electron injector is disposed along a first side of said floating gate and separated therefrom by said first grid insulator, said first grid electrode and said first retention insulator; and a tunneling hole injector including:
   a second conducting injector electrode from which holes are emitted;
   a second grid insulator disposed adjacent to said second conducting injector electrode;
   a second grid electrode disposed adjacent to said second grid insulator; and
   a second retention insulator disposed adjacent to said second grid electrode wherein said floating gate is disposed adjacent to said second retention insulator and said tunneling hole injector is disposed along a second side of said floating gate and separated therefrom by said second grid insulator, said second grid electrode and said second retention insulator.

17. A nonvolatile memory cell as in claim 16, wherein said floating gate has a conduction band edge and a valence band edge similar to a conduction band edge and a valence band edge of said first conducting injector electrode.

18. A nonvolatile memory cell as in claim 16, wherein said floating gate comprises polysilicon.

19. A nonvolatile memory cell as in claim 16, wherein said first retention insulator is formed of a layer of silicon oxide having a thickness in a range of about 8 nm to about 50 nm.

20. A nonvolatile memory cell as in claim 16, wherein said first grid electrode is thin enough to minimize loss of energy of injected charge carriers and thick enough to conduct away charge carriers that lose energy and are thermalized in said first grid electrode.

21. A nonvolatile memory cell as in claim 16, wherein said first grid electrode has a thickness in a range of about 10 nm to 50 nm.

22. A nonvolatile memory cell as in claim 18, wherein said first grid electrode comprises a metal having a work function with a fermi level that in a flat band condition lies in approximately the middle of band gap of said floating gate.

23. A nonvolatile memory cell as in claim 16, wherein said first grid electrode is formed of a metal selected from the group consisting of: Cr, Ni, Cu, and W.

24. A nonvolatile memory cell as in claim 16, wherein said first grid insulator is formed of a layer of silicon oxide having a thickness in a range of about 3 nm to about 6 nm.

25. A nonvolatile memory cell as in claim 16, wherein said first grid insulator has a thickness through which charge carriers will tunnel with application across said first grid insulator of a bias in a range of about 2 V to about 6 V.

26. A nonvolatile memory cell as in claim 16, wherein said first conducting injector electrode comprises n-type doped silicon.

27. A nonvolatile memory cell as in claim 26, wherein application of a negative bias from said first conducting injector electrode with respect to said first grid electrode will result in electrons tunneling from said first conducting injector electrode to said first grid electrode.

28. A nonvolatile memory cell as in claim 26, wherein application of a negative bias from said first conducting injector electrode with respect to said first grid electrode raises a conduction band of said first conducting injector electrode above a conduction band of said first retention insulator.

29. A nonvolatile memory cell as in claim 16, wherein said second retention insulator is formed of a layer of silicon oxide having a thickness in a range of about 8 nm to about 50 nm.

30. A nonvolatile memory cell as in claim 16, wherein said second grid electrode is thin enough to minimize loss of energy of injected charge carriers and thick enough to conduct away charge carriers that lose energy and are thermalized in said second grid electrode.

31. A nonvolatile memory cell as in claim 16, wherein said second grid electrode has a thickness in a range of about 10 nm to 50 nm.

32. A nonvolatile memory cell as in claim 16, wherein said second grid electrode comprises a metal having a work function with a fermi level that in a flat band condition lies in approximately the middle of a band gap of said floating gate.

33. A nonvolatile memory cell as in claim 16, wherein said second grid electrode is formed of a metal selected from the group consisting of: Pt, Cr, Ni, Cu, and W.

34. A nonvolatile memory cell as in claim 16, wherein said second grid insulator is formed of a layer of silicon oxide having a thickness in a range of about 3 nm to about 6 nm.

35. A nonvolatile memory cell as in claim 16, wherein said second grid insulator has a thickness through which charge carriers will tunnel with application across said second grid insulator of a bias in a range of about 2 V to about 6 V.

36. A nonvolatile memory cell as in claim 16, wherein said second conducting injector electrode comprises a metal having a work function that is greater than a work function of a metal of which said second grid electrode is comprised.

37. A nonvolatile memory cell as in claim 16, wherein application of a positive bias from said second conducting injector electrode with respect to said second grid electrode will result in holes tunneling from said second conducting injector electrode to said second grid electrode.

38. A nonvolatile memory cell as in claim 16, wherein said second conducting injector electrode comprises Pt.

39. A nonvolatile memory cell as in claim 38, wherein application of a positive bias from said second conducting injector electrode with respect to said second grid electrode lowers a fermi level of said second conducting injector electrode below a valence band of said second retention insulator.

40. A nonvolatile memory cell as in claim 16, wherein said second conducting injector electrode comprises p-type doped silicon.

41. A nonvolatile memory cell as in claim 40, wherein application of a positive bias from said second conducting injector electrode with respect to said second grid electrode lowers a valence band of said second conducting injector electrode below a valence band of said second retention insulator.

42. A nonvolatile memory device comprising:
   a plurality of nonvolatile memory elements arranged in a rectangular array of rows and columns, each of said plurality of non volatile memory elements including:
   a floating gate MOS transistor having a source region and a drain region formed in a semiconductor body and spaced apart by a channel region, a floating gate disposed above said channel region, and a control gate for said floating gate; and a tunneling charge injector having a conducting injector electrode, a grid insulator disposed adjacent to said conducting injector electrode, a grid electrode disposed adjacent to said grid insulator, and a retention insulator disposed adjacent to said grid electrode, wherein said floating gate is disposed adjacent to said retention insulator and said tunneling charge injector is disposed along a side of said floating gate and separated therefrom by said grid insulator, said grid electrode and said retention insulator;

a plurality of word lines, a separate one of said plurality of word lines coupled to said control gate of each of said plurality of nonvolatile memory cells in a same row;

a plurality of bit lines, a separate one of said plurality of bit lines coupled to said drain region of each of said plurality of nonvolatile memory cells in a same column;

a plurality of source lines, at least one of said plurality of source lines coupled to said source region of each of said plurality of nonvolatile memory cells in a same row;

a plurality of injector lines, at least one of said plurality of injector lines coupled to said conducting injector electrode of each of said plurality of nonvolatile memory cells in a same row; and a plurality of grid lines, at least one of said plurality of grid lines coupled to said grid electrode of each of said plurality of nonvolatile memory cells in a same column.

43. A nonvolatile memory device comprising:

a plurality of nonvolatile memory elements arranged in a rectangular array of rows and columns, each of said plurality of nonvolatile memory elements including:

a floating gate MOS transistor having a source region and a drain region formed in a semiconductor body and spaced apart by a channel region, a floating gate disposed above said channel region, and a control gate for said floating gate; and a tunneling electron injector having a first conducting injector electrode, a first grid insulator disposed adjacent to said first conducting injector electrode, a first grid electrode disposed adjacent to said first grid insulator, and a first retention insulator disposed adjacent to said first grid electrode, wherein said floating gate is disposed adjacent to said first retention insulator and said tunneling electron injector is disposed along a first side of said floating gate and separated therefrom by said first grid insulator, said first grid electrode and said first retention insulator;

a tunneling hole injector having a second conducting injector electrode, a second grid insulator disposed adjacent to said second conducting injector electrode, a second grid electrode disposed adjacent to said second grid insulator, and a second retention insulator disposed adjacent to said second grid electrode, wherein said floating gate is disposed adjacent to said second retention insulator and said tunneling hole injector is disposed along a second side of said floating gate and separated therefrom by said second grid insulator, said second grid electrode and said second retention insulator;

a plurality of word lines, a separate one of said plurality of word lines coupled to said control gate of each of said plurality of nonvolatile memory cells in a same row;

a plurality of bit lines, a separate one of said plurality of bit lines coupled to said drain region of each of said plurality of nonvolatile memory cells in a same column;

a plurality of source lines, at least one of said plurality of source lines coupled to said source region of each of said plurality of nonvolatile memory cells in a same row;

a first plurality of injector lines, at least one of said first plurality of injector lines coupled to said first conducting injector electrode of each of said plurality of nonvolatile memory cells in a same row;

a first plurality of grid lines, at least one of said first plurality of grid lines coupled to said first grid electrode of each of said plurality of nonvolatile memory cells in a same column;

a second plurality of injector lines, at least one of said second plurality of injector lines coupled to said second conducting injector electrode of each of said plurality of nonvolatile memory cells in a same row; and a second plurality of grid lines, at least one of said second plurality of grid lines coupled to said second grid electrode of each of said plurality of nonvolatile memory cells in a same column.

* * * * *